US011119142B1

(12) United States Patent
Gaide et al.

(10) Patent No.: US 11,119,142 B1
(45) Date of Patent: Sep. 14, 2021

(54) AUTOMATED CABLE ASSESSMENT AND CONTROL

(71) Applicant: AMAZON TECHNOLOGIES, INC., Seattle, WA (US)

(72) Inventors: Benjamin Thomas Gaide, San Jose, CA (US); Donald Joseph Brunnett, Pleasanton, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 174 days.

(21) Appl. No.: 15/888,983

(22) Filed: Feb. 5, 2018

(51) Int. Cl.
| | |
|---|---|
| *G01R 31/08* | (2020.01) |
| *G01R 27/16* | (2006.01) |
| *G01R 17/02* | (2006.01) |
| *G01R 31/58* | (2020.01) |
| *H01B 9/00* | (2006.01) |

(52) U.S. Cl.
CPC ............ *G01R 31/08* (2013.01); *G01R 17/02* (2013.01); *G01R 27/16* (2013.01); *G01R 31/58* (2020.01); *H01B 9/003* (2013.01)

(58) Field of Classification Search
CPC ........ G01R 31/08; G01R 17/02; G01R 27/16; G01R 31/021; H01B 9/003
See application file for complete search history.

(56) References Cited

U.S. PATENT DOCUMENTS

| 10,084,266 B1* | 9/2018 | Tsao | B60L 53/302 |
|---|---|---|---|
| 2016/0134381 A1* | 5/2016 | Malinin | H04B 1/707 375/130 |
| 2017/0097236 A1* | 4/2017 | Bender | G06Q 30/016 |
| 2017/0155518 A1* | 6/2017 | Yang | H04L 12/10 |
| 2017/0236181 A1* | 8/2017 | Ito | G06F 11/079 705/26.64 |
| 2017/0294794 A1* | 10/2017 | Li | H02J 7/0077 |

FOREIGN PATENT DOCUMENTS

DE  102010053074  *  8/2011  ............. B06L 53/18

* cited by examiner

*Primary Examiner* — Tung X Nguyen
*Assistant Examiner* — Feba Pothen
(74) *Attorney, Agent, or Firm* — Lindauer Law, PLLC

(57) ABSTRACT

A device may utilize a cable that includes connectors and conductors to transfer signals, electrical power, or both. Some cable failures result in an inability to transfer signals. Other failures may result from different cables being used at different times, resulting in a mismatch in which the cable is rated to transfer less power than what could otherwise be delivered by the power source. Parameters, such as cable impedance, transmitter gain, signal conditioning, and so forth that are associated with use of the cable are monitored at different times. If the values of these parameters from one time to another exceed a threshold value, a fault in the cable is determined. A notification about the impending or actual failure of the cable may be presented, and a suitable cable may be recommended for purchase. For example, a hyperlink may be provided to allow for purchase of the suitable cable.

20 Claims, 6 Drawing Sheets

AUTOMATED CABLE ASSESSMENT AND CONTROL

BACKGROUND

Electronic devices utilize cables to transfer one or more of electrical power or signals with other devices. Safe and reliable operation of these devices is desired to prevent injury to users, avoid harm to the surrounding environment, minimize damage to the devices themselves, maximize uptime, and so forth.

BRIEF DESCRIPTION OF FIGURES

The detailed description is set forth with reference to the accompanying figures. In the figures, the left-most digit(s) of a reference number identifies the figure in which the reference number first appears. The use of the same reference numbers in different figures indicates similar or identical items or features.

Figure 1:
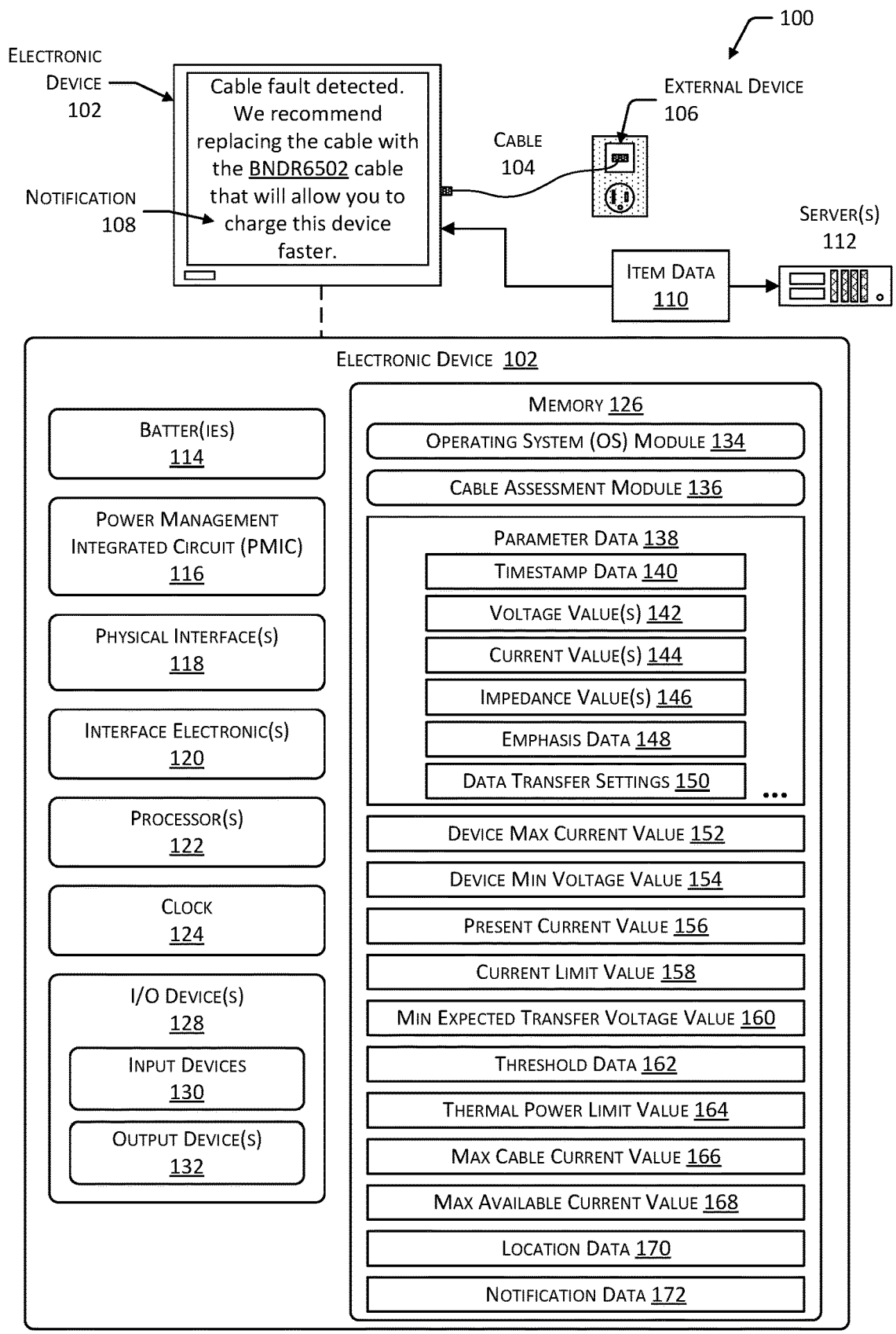
FIG. 1 depicts a system comprising an electronic device that assesses a connected cable to determine a fault and mitigate that fault, according to some implementations.

While implementations are described herein by way of example, those skilled in the art will recognize that the implementations are not limited to the examples or figures described. It should be understood that the figures and detailed description thereto are not intended to limit implementations to the particular form disclosed but, on the contrary, the intention is to cover all modifications, equivalents, and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean "including, but not limited to".

The structures depicted in the following figures are not necessarily according to scale. Furthermore, the proportionality of one component to another may change with different implementations. In some illustrations the scale or a proportionate size of one structure may be exaggerated with respect to another to facilitate illustration, and not necessarily as a limitation.

DETAILED DESCRIPTION

An electronic device may utilize a cable to receive electrical power, signals, and so forth with an external device. For example, a smartphone may be connected via a cable to an external charger. In another example, a device may use a cable to receive electrical power from an external power supply. In another example, an electronic device may send image data via a cable to a television or other display device.

The use of standardized cables results in the potential for mismatches between cables and devices. For example, a smartphone charger may comprise a universal serial bus (USB) compliant power supply with which a USB cable is used to connect the charger to the smartphone. As a result, the cable connecting the smartphone to the charger may differ from that which was originally provided. For example, the user may replace a white USB cable that was included with the charger with a green USB cable. These cables may have different current handling capabilities. Continuing the example, a mismatch may occur between the current carrying capability of the green cable and the maximum available current that the charger is able to provide. For example, the green cable may be limited to transferring a maximum of 1 ampere (A) while the charger may be able to supply 2 A of current. In another example, the green cable may be limited to transferring 5 A of current, while the charger is only able to supply 1 A of current. In yet another example, the green cable may be limited to transferring 1 A while the charger is limited to providing 1 A. If the smartphone has a device max current of 3 A, it will still work with the green cable and the charger, but the reduction from 3 A to 1 A will result in a longer time to charge the smartphone.

Mismatches between the cable and the external device may result in undesirable operation. As mentioned above, a mismatch may result in the device receiving less electrical power than desired, such as resulting in a relatively slow battery charge. Mismatches may also result in potentially unsafe situations. For example, if the current transferred by the cable exceeds a threshold value, or if the cable or associated connectors are otherwise impaired, the cable or a portion thereof may dissipate an undesired amount of heat. For example, a faulty connector may exhibit increased impedance, resulting in a localized increase in temperature during increased levels of current transfer. Such a localized increase could result in an unsafe condition, such as thermal failure of the cable.

Cables that transfer data signals may also exhibit failures. For example, a USB or a high-definition multimedia interface (HDMI) cable may be used to transfer image data from an electronic device to a display device. The cable may fail due to a broken conductor, connector contamination, wear due to use, and so forth. As a result, the ability for the cable to transfer data signals may be impaired. This may result in a failure, such as the display no longer presenting image data.

Described in this disclosure are techniques for determining one or more parameters of a cable that is connected to an electronic device. The parameters may include electrical characteristics associated with the cable, such as voltage, current, impedance, and so forth. The parameters may also include information about use of the cable. For example, emphasis data indicative of gain or attenuation by a transmitter or receiver connected to the cable. This emphasis data may be used to determine changes in performance of the cable.

Faults may be actual or potential. For example, an actual fault comprises a failure of a cable, such as the inability of the cable to transfer a signal or power due to a broken connector. In comparison, a potential fault may comprise a situation in which operation is possible, but performance may be degraded relative to a non-fault situation. For example, a mismatch in which the cable cannot supply the device max current value may be a potential fault. Continuing this example, the cable may still be used to supply power, but current transfer is limited to the max cable current value.

Faults may be associated with one or more of the cable or the external device. For example, an increase in impedance of the cable from one time to another may be indicative of a failure of the cable. In another example, a failure of the external device to supply sufficient current may be determined based on a drop in the voltage provided to the electronic device that is greater than that expected by the impedance.

Based on the parameters, various limits may be determined and used to facilitate operation of one or more of the electronic device, the cable, or the external device. For example, an increase in impedance of the cable beyond a threshold value may result in a notification being presented with a user interface, recommending a replacement cable. In another example, a determination that the external device is unable to deliver the maximum amount of current that the electronic device is able to use may result in a notification that includes a recommendation to use a different charger, or includes a link to a web page that offers a new charger for sale.

In one implementation, the quantity of current supplied by an external device to the electronic device may be controlled, while voltage is measured at different levels of current consumption. Impedance of the cable may be calculated using the difference between voltages corresponding to different levels of current consumption.

Once determined, the impedance may be compared with a threshold value, compared to a previously acquired impedance, used to determine a maximum cable current value, and so forth. For example, the maximum cable current value may specify a maximum quantity of current that may be transferred by the cable. The maximum cable current value may be calculated based on the impedance and a thermal power limit associated with the cable. Once known, operation of the electronic device may be constrained to prevent transferring more power than the cable has been determined to be able to handle. A notification may also be provided that notifies the user that performance is limited by the cable. The notification may include a link to a web page that offers a suitable cable for sale.

The parameters may also be used to characterize the external device. Once characterized, the use of the external device may be constrained. For example, over time the amount of current transferred to the electronic device may be increased. At different levels of current transfer, voltages may be measured. If the voltage value at a particular level of current transfer falls below a minimum expected transfer voltage, this may be indicative of strain on the external device to provide that particular level of current to the electronic device.

The minimum expected transfer voltage may be determined based at least in part on parameters, such as the impedance of the cable. As a result, the system may reduce the amount of current being transferred. Such a reduction reduces the demand on the external device, reducing the risk of failure of the external device, damage to the electronic device from a low voltage condition, and so forth. A notification may also be provided that advises the user of the electronic device that the external device is unable to meet the needs of the electronic device. The notification may include a link to acquire a suitable electronic device that is able to meet the demand of the electronic device.

Telemetry data associated with the performance of the cable, external device, and so forth may be acquired from the electronic devices. The telemetry data may be processed to improve the overall user experience. For example, the telemetry data may be used to determine a failure rate of deployed cables. In some implementations the telemetry data may be indicative of particular cables. For example, a cable may include circuitry that allows a cable to be identified, such as transmitting a serial number or producing a predetermined pattern of resistance. This identification may be included in the telemetry data, allowing for trend data to be acquired.

In some implementations, parameter data may be used to predict a failure or recommend replacement in advance of an actual failure. For example, based on historical data of impedance changes over time, failure of a cable may be anticipated. The user may be provided with a notification that includes a link to a web page that offers a new cable for sale.

By using the techniques described in this disclosure, a user is able to more easily and proactively deal with the failure of one or more components that support their electronic device. Suboptimal performance resulting from mismatches between the electronic device, the cable, and the external device may be detected and proactively addressed, improving performance of the electronic device as well as the user experience. Safety is also improved as potentially unsafe conditions are mitigated. Finally, uptime and accessibility of the electronic device is improved by quickly and easily recommending to the user options as to what cable, external device, or both that may be needed to resolve a fault.

Illustrative System

FIG. 1 depicts a system 100 comprising an electronic device 102 that assesses a cable 104 that is connected to an external device 106, according to some implementations. The cable 104 may be used to transfer one or more of electrical power or data signals between the electronic device 102 and the external device 106.

By way of illustration, and not necessarily as a limitation, the electronic device 102 is depicted as a tablet computer. In other implementations the electronic device 102 may comprise a smartphone, camera, network connected speaker, and so forth.

Also by way of illustration, and not necessarily as a limitation, the external device 106 may comprise a charger for the tablet computer shown here. In other implementations, the external device 106 may comprise a power supply, battery pack, source of data, sink for data, and so forth. For example, the external device 106 may comprise a display device that presents video transmitted from the tablet computer to the display via the cable 104.

The cable 104 may comprise one or more electrical conductors, optical waveguides, radio frequency waveguides, acoustic transfer media, and so forth. The cable 104 may be terminated in one or more connectors. For example, the cable 104 may be compliant with at least a portion of the universal serial bus (USB) specification as promulgated by the USB Implementers Forum, such as including twisted pairs of AWG 26 wires that are inside a shield. In another example, the cable 104 may be compliant with at least a portion of the high-definition multimedia interface (HDMI) specification as promulgated by the HDMI Forum. In still another example, the cable 104 may be compliant with at least a portion of the serial AT attachment (SATA) specifications as promulgated by the Serial ATA international Organization.

In some implementations the cable 104 may include circuitry that facilitates identification of the cable 104. The identification may be indicative of a type, model, batch of cables, or a specific individual cable. For example, the cable 104 may include a specific pattern of electrical resistance between particular conductors in the cable 104. This specific pattern may be used to designate a particular type or model of cable 104. In another example, the cable 104 may include a microcontroller or other device that is able to provide information, such as data indicative of a cable identifier (ID), make, model, manufacturer, batch number, date of manufacture, usage statistics and so forth. For example, the microcontroller may maintain usage statistics such as a count of connects/disconnects of the cable 104.

The electronic device 102 presents a notification 108 in a user interface. This notification 108 may be based at least in part on item data 110 obtained from a server 112. As described below, in the event that a failure of one or more of the cable 104 or the external device 106 is determined, the notification 108 may be used to provide the user with information about the failure and suggest replacement parts to mitigate the failure. For example, the notification 108 may advise the user that the cable 104 is keeping the electronic device 102 from charging as quickly as it could, and provide a link to a website offering a particular cable for sale that will allow for higher speed charging. Continuing the example, the electronic device 102 may receive item data 110 indicating the item number, availability, cost, and so forth, for the recommended cable.

The electronic device 102 may utilize electrical power obtained from the external device 106. The power obtained from the external device 106 may be stored in one or more batteries 114 for later use when the cable 104 is disconnected. The batteries 114 may be rechargeable (secondary) batteries, such as rechargeable lithium ion batteries, lithium polymer batteries, nickel metal hydride batteries, and so forth.

The electronic device 102 may include a power management integrated circuit (PMIC) 116. The PMIC 116 may include a microprocessor, microcontroller, or other programmable control circuitry that is able to control the consumption and distribution of electrical power by the electronic device 102. For example, the PMIC 116 may control current transferred by the electronic device 102 from the external device 106, control charging the batteries 114 using the power from the external device 106, and so forth. In some implementations, a separate charger controller may be used to control charging of the one or more batteries 114. Operation of the charger controller may be directed by the PMIC 116.

The PMIC 116 may also include, or may operate in conjunction with, one or more voltage monitors. The voltage monitors may be used to provide information about the voltage differential between different components of the electronic device 102, power from the external device 106 as provided by the cable 104, or within the components of the electronic device 102.

The PMIC 116 may also include, or may operate in conjunction with, one or more current monitors. The current monitors may be used to provide information about the current transferred through various parts of the electronic device 102, such as the current flow of power from the external device 106 as provided by the cable 104, or within the components of the electronic device 102. The PMIC 116 may include other monitoring circuitry and devices, such as impedance monitors to measure electrical impedance, capacitance monitors to measure electrical capacitance, and so forth.

The electronic device 102 may include one or more physical interfaces 118. The physical interface 118 may comprise one or more physical structures such as connectors that are configured to mate with a corresponding physical structure of the cable 104. For example, the physical interface 118 may comprise a USB compliant micro-B SuperSpeed receptacle that is configured to mate with a micro-B SuperSpeed plug. The physical interface 118 may include one or more contacts, pins, pads, and so forth.

Interface electronics 120 are connected to the physical interfaces 118. The interface electronics 120 control and facilitate operation of the interface during use. For example, the interface electronics 120 may comprise a USB host controller device, HDMI controller, SATA controller, and so forth. The interface electronics 120 may include voltage monitors, current monitors, current regulators, and so forth. For example, the USB host controller device may include a voltage monitor that is able to provide data indicative of the voltage received at the physical interface 118. In some implementations, the interface electronics 120 may operate in conjunction with the PMIC 116.

The interface electronics 120 and the physical interfaces 118 may be configured to provide communications between the electronic device 102 and other devices, such as the server 112. For example, a network interface may provide for connection to personal area networks (PANs), wired or wireless local area networks (LANs), wide area networks (WANs), and so forth. For example, the network interfaces may include devices compatible with Ethernet, Wi-Fi, Bluetooth, Bluetooth Low Energy, ZigBee, and so forth. Some of the interfaces of the electronic device 102 may not utilize a physical interface 118 that mates with a cable. For example, the wireless LAN interface may utilize a radio transmitter and radio receiver to transfer data without a cable 104.

The electronic device 102 may include one or more hardware processors 122 (processors) configured to execute one or more stored instructions. The processors 122 may comprise one or more cores. The processors 122 may include general purpose microprocessors, graphic processing units, microcontrollers, application specific integrated circuits (ASICs), digital signal processors (DSPs), and so forth. One or more clocks 124 may provide information indicative of date, time, ticks, and so forth.

The electronic device 102 includes one or more memories 126. The memory 126 may comprise one or more non-transitory computer-readable storage media (CRSM). The CRSM may be any one or more of an electronic storage medium, a magnetic storage medium, an optical storage medium, a quantum storage medium, a mechanical computer storage medium, and so forth. The memory 126 provides storage of computer-readable instructions, data structures, program modules, and other data for the operation of the electronic device 102. Functional modules may be stored in the memory 126, although the same functionality may alternatively be implemented in hardware, firmware, as a system on a chip (SoC), and so forth. For example, the memory 126 may include at least one operating system (OS) module 134 that is configured to manage operation of components, provide various services to applications or modules executing on the processors 122, and so forth.

The electronic device 102 may be connected to or include one or more input/output (I/O) devices 128. The I/O devices 128 may include input devices 130. The input devices 130 may include but are not limited to, touch sensors, microphones, cameras, inertial measurement units (IMU), positioning systems, temperature sensors, humidity sensors, and so forth. For example, the input devices 130 may include a global position system (GPS) receiver, or other positioning system that provides information indicative of a location of the electronic device 102. The IMU may include one or more vibration sensors, accelerometers, gyroscopes, and so forth.

The I/O devices 128 may include output devices 132. The output devices 132 may include but are not limited to displays, speakers, haptic output devices, and so forth. The output devices 132 are configured to generate signals, which may be perceived by the user or may be detected by input devices 130. In some embodiments, the I/O devices 128 may be physically incorporated with the electronic device 102 or may be externally placed.

The electronic device 102 may also include one or more busses or other internal communications hardware or software that allow for the transfer of data between the various modules and components of the electronic device 102.

The memory 126 may store an operating system (OS) module 134. The OS module 134 is configured to manage hardware resource devices such as the PMIC 116, the interface electronics 120, the I/O devices 128, and provide various services to applications or modules executing on the processors 122. The OS module 134 may implement a variant of the FreeBSD operating system as promulgated by the FreeBSD Project; other UNIX or UNIX-like variants; a variation of the Linux operating system; the Windows operating system from Microsoft Corporation of Redmond, Wash., USA; and so forth.

A cable assessment module 136 may be stored in the memory 126 and executed at least in part on the processor 122. In some implementations, one or more of the functions of the cable assessment module 136 may be performed by different devices. For example, at least a portion of the functions may be performed on the PMIC 116, the interface electronics 120, the processors 122, and so forth.

The cable assessment module 136 may be configured to acquire parameter data 138 about one or more cables 104 that are attached to the physical interfaces 118 of the electronic device 102. The parameter data 138 may comprise information about one or more of the cable 104, the physical interface 118, or the interface electronics 120 at particular times.

The parameter data 138 may include one or more of timestamp data 140, voltage values 142, current values 144, impedance values 146, emphasis data 148, data transfer settings 150, and so forth.

The timestamp data 140 may comprise data indicative of time, such as provided by the clock 124. In some implementations the timestamp data 140 may include information indicative of date.

The voltage values 142 comprise data indicative of a voltage as measured by one or more of the voltage monitors in the electronic device 102. For example, a voltage monitor in the interface electronics 120 may provide information about the voltage as measured between positive and negative power pins of the physical interface 118. The voltage values 142 may be associated with a particular time. The voltage values 142 may be measured in volts (V).

The current values 144 comprise data indicative of a current as measured by one or more of the current monitors in the electronic device 102. For example, a current monitor in the interface electronics 120 may provide information about the current flow between the positive and negative power pins of the physical interface 118. The current values 144 may be associated with a particular time. The current values 144 may be measured in amperes (A).

The impedance values 146 comprise data indicative of impedance of one or more conductors. The impedance values 146 are indicative of the opposition to flow of current when a voltage is applied to one or more conductors or other circuit elements. The impedance values 146 may be calculated from other parameters. For example, voltage values 142 and current values 144 may be used to calculate an impedance value 146 of the cable 104. The impedance values 146 may be measured in ohms (Z). The impedance of the cable 104 may be determined using the following equation:

$$Z_{Cable} = \frac{V_2 - V_1}{I_2 - I_1}$$

where $V_1$ is voltage at a first time, $V_2$ is voltage at a second time, $I_2$ is current at the first time, and $I_1$ is current at the second time.

Equation 1

During operation, the cable assessment module 136 may test at a first current $I_1$ that is approximately 0 A. For example, the value of $I_1$ may be less than 1 microampere (μA). The first current $I_1$ is associated with minimal transfer of current from the external device 106. For example, this is enough current to provide a voltage that may be measured, but is insufficient to place a significant demand on the external device 106 to supply current. In comparison, the value of the second current $I_2$ may be 0.1 A.

The emphasis data 148 comprises information about signal conditioning that is used in the transmission or reception of a signal. This signal conditioning may include pre-emphasis, de-emphasis, and so forth. The use of signal conditioning may improve data transfer performance in situations where the cable 104 is less than optimal. For example, the interface electronics 120 may implement a 3 decibel (3 dB) increase in voltage swing for signals that are transmitted to produce a readable signal at the external device 106. In another example, the interface electronics 120 may implement a 3 dB attenuation for received signals below a particular frequency. The signal conditioning may modify the waveform of a signal for transmission, or after it has been received. For example, the emphasis data 148 may indicate settings that are used to control operation of the interface electronics 120 to change one or more of the amplitude, timing, voltage swing, and so forth of transmitted or received signals.

The data transfer settings 150 provide information about how data sent via the cable 104 is being formatted, encoded, or otherwise managed for transfer between the electronic device 102 and the external device 106. In one implementation, the data transfer settings 150 may include information including data transmission rate of the signal, encoding scheme, frequency of the signal, and so forth. For example, the data transfer settings 150 for the USB interface electronics 120 may specify the current data transfer rate of the USB connection to the external device 106.

The memory 126 may also store one or more of the following values. During operation of the cable assessment module 136, one or more of the values may be retrieved from memory or determined based at least in part on one or more of the parameter data 138 or other values.

A device max current value 152 specifies the maximum current that the electronic device 102 is expected to use during operation. For example, the device max current value 152 may indicate that the device during peak usage consumes 3 A of current. The device max current value 152 may be pre-determined or may be determined based on previous usage.

A device min voltage value 154 specifies the minimum voltage that the electronic device 102 requires during operation. For example, the device min voltage value 154 may indicate that the electronic device 102 requires a minimum of 4.3 V to operate. The device min voltage value 154 may be pre-determined.

A present current value 156 specifies the quantity of current provided by the external device 106 that is flowing through the physical interface 118 and associated interface electronics 120 of the electronic device 102 at a particular time. For example, the present current value 156 may indicate that the external device 106 is providing 1.5 A to the electronic device 102 at timestamp 20180102003644. The present current value 156 may be measured using one or more current monitors of one or more of the interface electronics 120, the PMIC 116, the external device 106, and so forth.

A current limit value 158 specifies a maximum amount of current that is permitted to be transferred from the external device 106 to the electronic device 102 at a particular time. The current limit value 158 may vary based on one or more of time, the particular cable 104 that is in use, the particular external device 106 that is in use, and so forth. For example, as described below, the cable assessment module 136 may set the current limit value 158 to the lesser of the max cable current value 166 or the max available current value 168, as described below.

A min expected transfer voltage value 160 specifies a minimum voltage that is expected to be measured at the electronic device 102 during normal operation of the external device 106. For example, the min expected transfer voltage value 160 indicates the minimum expected voltage at the interface electronics 120 after taking into account the voltage drop due to the impedance of the cable 104. In one implementation, the min expected transfer voltage value 160 may be calculated using the following equation:

$$\text{Min Expected Transfer Voltage Value} = \frac{V_{I \cong 0} - (I_{Present} * Z_{Cable})}{T}$$

where $V_{I \cong 0}$ is the voltage as measured when current transfer is approximately zero, such as less than 1 microampere (µA), $I_{present}$ is the present current value 156 at a particular time, $Z_{cable}$ is the impedance of the cable 104, and T is a correction factor to account for expected accuracy of the voltage monitors. For example, the value of T may be 0.9 to account for an expected accuracy of an analog to digital converter (ADC) measuring the voltage as having a 10% tolerance.
Equation 2

The min expected transfer voltage value 160 provides an indication of what the voltage delivered to the interface electronics 120 is after an expected or typical drop in the cable 104. If the actual measured voltage is less than this expected transfer, then the cable assessment module 136 may determine that the external device 106 is unable to supply the present quantity of current. As a result, the PMIC 116 or other device may reduce the consumption of current from the external device 106.

The threshold data 162 may specify minima, maxima, ranges, and so forth. For example, the threshold data 162 may specify an impedance threshold value that is used to determine if a cable 104 has failed. The threshold data 162 may be predetermined, or may be dynamically adjusted. For example, the impedance threshold value may be based on a percentage of a previously measured impedance value 146.

A thermal power limit value 164 specifies a maximum amount of power that a cable 104 is determined to be able to dissipate without failure. For example, the wiring and associated connectors of the cable 104 may be able to dissipate 3 watts of thermal energy without a thermal failure. In some implementations the thermal power limit value 164 may also be indicative of the maximum amount of power that the cable 104 and any associated portion of the physical interface 118 are able to dissipate without failure. For example, in the event of a contaminant being present between the connector on the cable 104 and the physical interface 118, the thermal power limit value 164 may include the maximum amount of power that the physical interface 118 is able to dissipate.

The thermal power limit value 164 may be determined based on testing, simulation, previously acquired parameter data 138, and so forth. For example, the thermal power limit value 164 for a particular make and model of cable 104 may be defined as part of a manufacturing standard. The thermal power limit value 164 may be lower than an actual power dissipation value associated with cable 104 failure. For example, a cable 104 may exhibit thermal failure when dissipating 10 watts of electrical power. Continuing the example, the thermal power limit value 164 for that cable 104 may be set to a lesser value, such as 5 watts. If a thermal power limit value 164 is not available for a particular cable 104, a default value may be used.

A max cable current value 166 specifies a maximum current that may be transferred using the cable 104, as constrained by the thermal power limit value 164 and the impedance value 146 of the cable 104. In one implementation, the max cable current value 166 may be determined using the following equation:

$$\text{Max Cable Current Value} = \sqrt{\frac{\text{Thermal Power Limit Value}}{Z_{Cable}}}$$

where the thermal power limit value 164 is as described above and $Z_{Cable}$ is the impedance value 146 of the cable 104 as described above with regard to Equation 1.
Equation 3

In some implementations, the max cable current value 166 may be accessed from previously stored data. For example, the cable 104 may have a cable identifier (cable ID) indicative of the particular cable, or a make or model of the cable. The max cable current value 166 may be retrieved based on the cable identifier.

A max available current value 168 specifies the maximum available current that the external device 106 is deemed to be able to provide. For example, if the external device 106 is 5 A USB hub, it should be able to provide 5 A of power continuously. The max available current value 168 may be determined by the cable assessment module 136 based on one or more of the parameter data 138. In some situations the specifications of the external device 106 may be unknown, or the external device 106 may experience performance degradation. By determining the max available current value 168 through testing, the cable assessment module 136 is able to subsequently limit the transfer of current from the external device 106 to prevent damage to the external device 106 resulting from excessive demand for current.

In one implementation, the max available current value 168 may be determined by determining voltage values 142 while consuming different current values 144. For example, the cable assessment module 136 may acquire voltage values 142 while successively increasing the present current value 156. Continuing the example, the electronic device 102 may draw almost no current at a first time, then 0.1 A at a second time, then 0.2 A at a third time, then 0.3 A at a fourth time, and so on.

At each of these times, the voltage values 142 may be determined. At the point at which the external device 106 begins to have difficulty supplying the level of current being consumed, the voltage value 142 at that current value 144 will drop below the min expected transfer voltage value 160. Once this drop has been detected, the cable assessment module 136 may then "back off" and reduce the current consumption. Operation may then continue at this reduced level of current consumption.

By detecting the drop in voltage and then subsequently constraining the current consumption by the electronic device 102 to a lower value, several benefits accrue. For example, the external device 106 may be placed under less thermal stress by the reduced demand for current, resulting in a reduced risk of damage or failure.

If the cable assessment module 136 determines that the max available current value 168 is less than the device max current value 152, a notification 108 may be generated for presentation. The notification 108 may provide the user with an opportunity to acquire a replacement external device 106 that is better able to meet the demands of the electronic device 102.

The cable assessment module 136 may constrain current consumption based on the various values described above. For example, the cable assessment module 136 may set the current limit value 158 to the lesser of one or more of the device max current value 152, the max cable current value 166, or the max available current value 168. As a result, the cable assessment module 136 protects from potential failures resulting from the electronic device 102 inadvertently drawing too much power, the cable 104 dissipating too much heat, or the external device 106 being strained to produce too much current.

The memory 126 may store location data 170, such as obtained from a positioning system such as GPS, Wi-Fi locating services, Bluetooth beacons, and so forth. The location data 170 may provide information about the location of the electronic device 102. The location may be actual, such as latitude and longitude, street address, and so forth. The location may be relative, such as "in the car", "in the kitchen", or "at work".

The user may choose to opt-in, permitting collection of location data 170 that may be associated with parameter data 138. By collecting location data 170, the cable assessment module 136 may be able to maintain historical parameter data 138 and determine potential faults in advance. For example, the location data 170 may be used to determine that the electronic device 102 is "in the kitchen". Parameter data 138 associated with the cable 104 and external device 106 that are "in the kitchen" may be maintained, and analyzed. Continuing the example, it may be determined that cables 104 at the location "in the kitchen" have an increased failure rate. As a result, the threshold data 162 for this location may have stricter thresholds than another location, such as "at work", facilitating an earlier detection of a potential failure.

The location data 170 may also be used to facilitate the acquisition of replacement cables 104 or external devices 106. For example, the location data 170 may be used to determine a ship to address, and the server 112 may determine those suitable replacement items that are able to be delivered to the ship to address at the earliest available date.

The cable assessment module 136 may use other data as well during operation. In one implementation, data from the interface electronics 120 may be used to determine a count of connects/disconnects of the cable 104. This count may be used along with the parameter data 138 to determine failure in the cable 104, external device 106, and so forth. In another implementation, data from the IMUs may be used to provide information about movement of the electronic device 102, vibration experienced by the electronic device 102, and so forth. For example, if the IMU indicates movement of the electronic device 102 from a first time to a second time and there has been a change in impedance value 146 of the cable 104 that exceeds a threshold value, the cable 104 may be deemed to be failed.

The cable assessment module 136 may generate notification data 172. The notification data 172 may comprise programmatic code, tags, text, images, hyperlinks, uniform resource locators, uniform resource identifiers, network addresses, and so forth. For example, the notification data 172 may comprise a hypertext markup language (HTML) document that includes text to the user indicating the nature of the failure that has been detected and includes a control for the user to click on to acquire the hardware to resolve the fault. The control may comprise a link that is indicative of a particular network address that is associated with presenting information or purchase details about one or more recommended replacements. The notification data 172 may include item data 110, indicative of a particular item, such as a replacement cable 104, replacement external device 106, and so forth.

When processed, the notification data 172 may be used to present at least a portion of the notification 108. For example, a web rendering engine may process the HTML document and produce output on a display. The notification data 172 may also be used to provide audible, haptic, or other output. The notification data 172 may be provided to the electronic device 102, or to another device. For example, the notification data 172 may be provided to a network-enabled speaker that provides audio output, such as synthesized human speech. In one implementation, the network-enabled speaker may be associated with the electronic device 102 based on association with a common account. If the network-enabled speaker includes microphones, the user's audible response may be used to initiate action to acquire a replacement item. Continuing the example, the user may respond to the notification by asking for the replacement cable to be ordered.

The memory 126 may store historical data for later comparison, trend analysis, and so forth. For example, historical impedance values 146 that have been previously determined may be stored and compared to recently determined impedance values 146. In some implementations, at least a portion of the historical data, or data based at least in part on the historical data, may be sent to another device. For example, a user may opt-in to allow historical data to be sent to the server 112.

Figure 2:
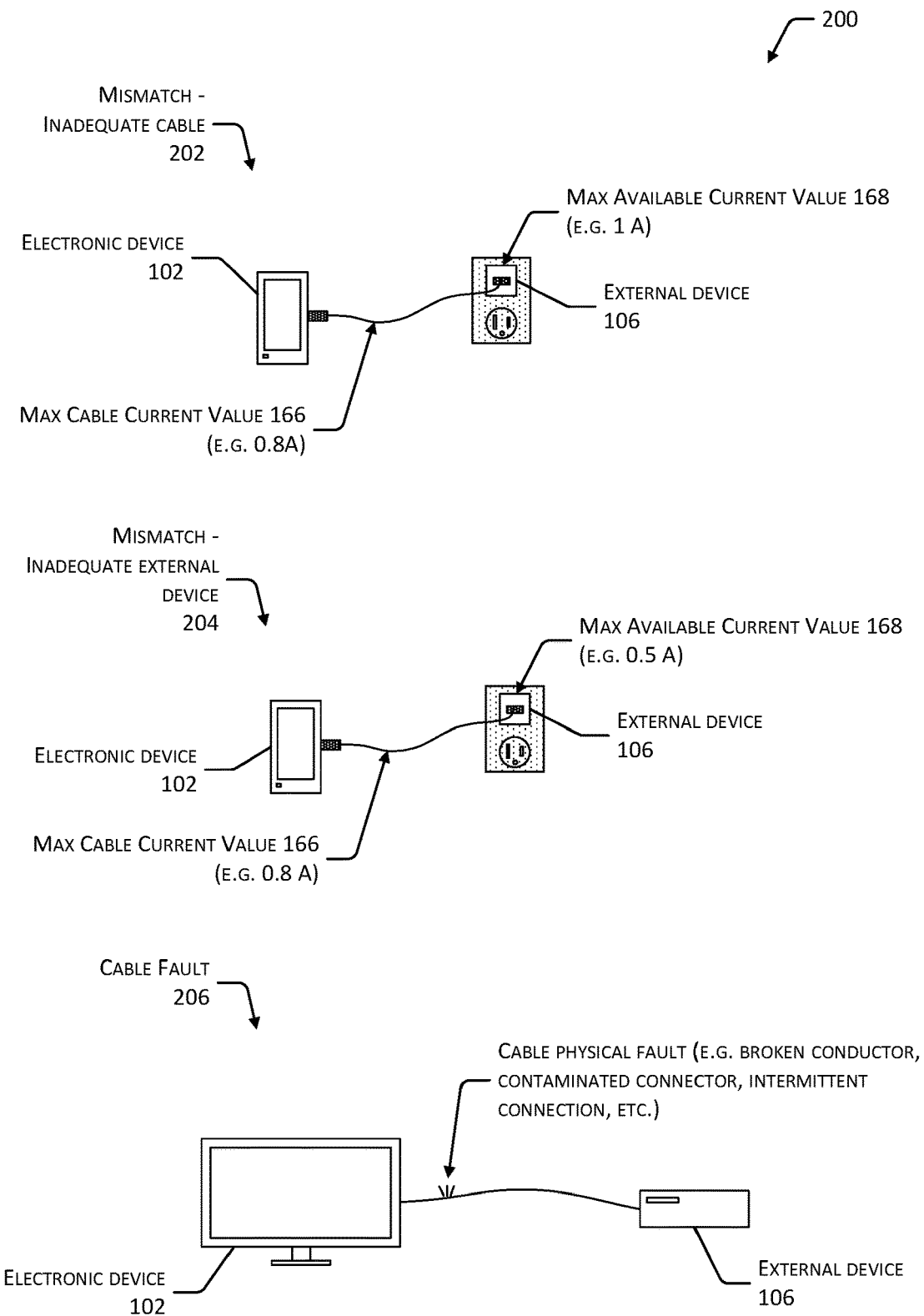
FIG. 2 illustrates various faults that may be determined using the system of FIG. 1, according to some implementations.

FIG. 2 illustrates at 200 various faults that may be determined using the system of FIG. 1, according to some implementations. As described above, the use of standardized cables 104 and external devices 106 introduces the potential for various failure scenarios.

At 202 a mismatch involving an inadequate cable 104 is shown. In this scenario the external device 106 is able to provide a max available current value 168 that exceeds the max cable current value 166. For example, the external device 106 may comprise a charger that is able to deliver 1 A of current, while the cable 104 is determined to be able to transfer a maximum of 0.8 A. In this scenario, the cable 104 is a limiting factor, preventing the electronic device 102 from receiving the maximum amount of power. This reduction in power delivery may result in adverse impacts, such as the processors 122 of the electronic device 102 being unable to operate at maximum clock speed, increased charging time of the batteries 114, and so forth.

At 204 a mismatch involving an inadequate external device 106 is shown. In this scenario, the max cable current value 166 of 0.8 A exceeds the max available current value 168 of the external device 106 of 0.5 A. Because the cable 104 is able to transfer more power than the external device 106 is able to deliver, the external device 106 is now the limiting device, reducing the power that is available and adversely impacting the electronic device 102.

A cable fault 206 scenario is depicted. Cable faults may arise from electrical or mechanical failures in the cable 104. For example, connectors may become contaminated or break, wires may break, solder joints may fail, circuitry within the cable 104 may be damaged, and so forth. The cable fault 206 may result in increased impedance values 146. The cable fault 206 may impair the ability of the cable 104 to transfer one or more of electrical power or data signals. For example, damage that increases impedance of the conductors in the cable 104 may result in an impedance mismatch, attenuating data signals propagated by the cable 104. As a result of this attenuation, the cable 104 may fail to reliably transfer data between the electronic device 102 and the external device 106.

By using the techniques described in this disclosure, these and other fault scenarios may be detected. Failures may be automatically isolated to particular parts of the system 100, such as the cable 104, the external device 106, or both. As a result, less time is spent determining the point of failure. The notification 108 may be provided that is tailored to the particular failure, providing information about the specific failure, but also possible remedies. For example, in the case of scenario 202, the notification 108 may instruct the user to try another cable 104 or order a recommended cable 104 that is able to transfer the needed power.

By simplifying the troubleshooting and mitigation, significant improvements are realized. Overall safety is improved due to the constraints on power transfer. Uptime of the electronic device 102 is improved due to the reduction in failures and the swift replacement of parts of the system that are inadequate. Expensive and time consuming human intervention to troubleshoot and propose mitigation is reduced or eliminated. For example, instead of needing to call technical support, the electronic device 102 is able to determine the fault and provide a recommended resolution.

Figure 3:
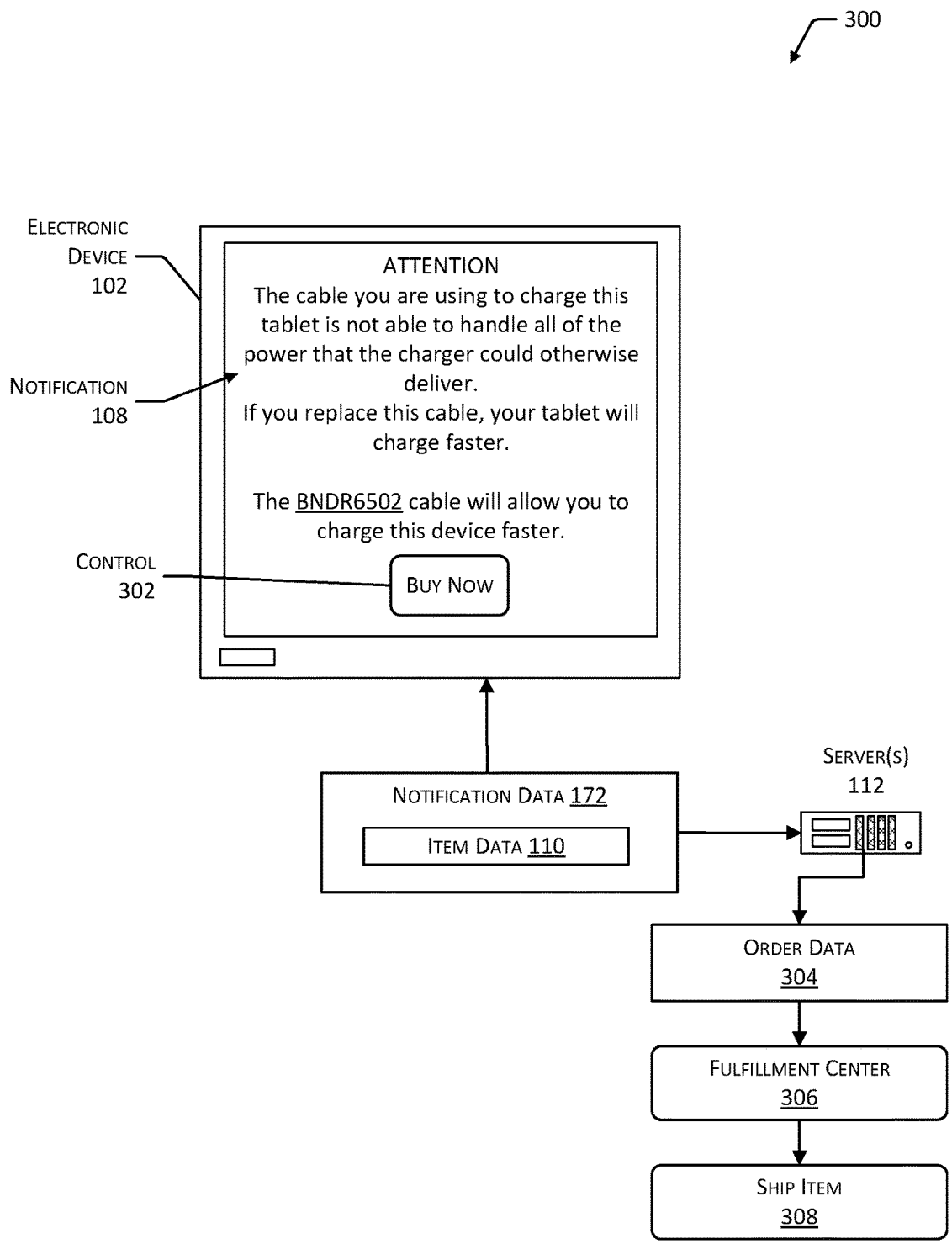
FIG. 3 illustrates a user interface presenting a notification with a control allowing a user to select an appropriate cable to replace the existing faulty cable, according to some implementations.

FIG. 3 illustrates a system 300 that includes presenting a notification 108, according to some implementations. In this illustration, the user interface 300 is provided by the electronic device 102. In other implementations, the user interface 300 may be provided using other devices.

As described above, the cable assessment module 136 has determined a failure in one or more of the cable 104 or the external device 106. Information indicative of this failure may be provided to the server 112 that provides the notification data 172 to the electronic device 102. The notification data 172 may include item data 110. The item data 110 may be indicative of a particular item, such as a replacement cable 104, replacement external device 106, and so forth.

When presented, the notification 108 in the user interface 300 may include a control 302. For example, the graphical user interface shown here includes a control 302 in the form of a button, that the user may activate to order a recommended replacement cable. In other implementations a plurality of recommended replacements may be presented.

Activation of the control 302 may send a response to the server 112 that proceeds to create order data 304 indicative of an order by the user of the cable. The order data 304 may be provided to a fulfillment center 306 that processes the order and then ships the item 308 to the user. From the point of view of the user, from detection of the failure to resolution is significantly reduced compared to traditional techniques. The failure was quickly determined, a proposed resolution was presented, and the user initiated the action to resolve the problem with minimal time spent on their behalf.

In some implementations, the server 112 may not recommend purchase. For example, if the cable 104 or the external device 106 is under warranty, an option for a warranty replacement may be provided. In another example, if the server 112 determines from order history data that the necessary replacement device has been ordered, the notification 108 may include a reminder to use the previously ordered replacement.

Figure 4:
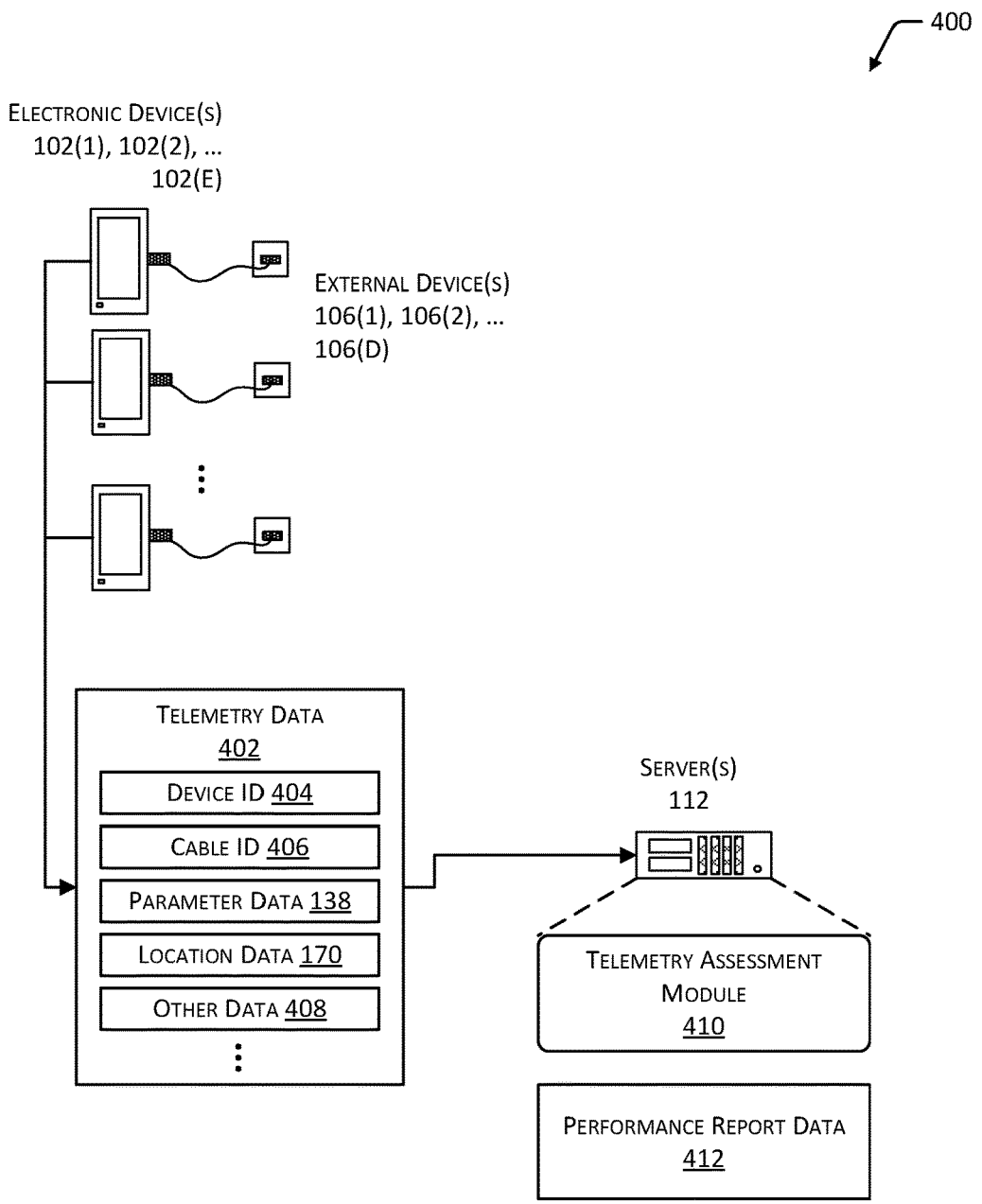
FIG. 4 illustrates telemetry data being obtained from a plurality of electronic devices 102 to allow for assessment of deployed cables and external devices such as chargers, according to some implementations.

FIG. 4 illustrates a system 400 in which telemetry data 402 is acquired from a plurality of electronic devices 102. By assessing this telemetry data 402, trends in the operation and failure of deployed cables 104 and external devices 106 may be determined.

In this illustration, a plurality of electronic devices 102(1), 102(2), . . . , 102(E) are connected via cables 104 to external devices 106(1), 106(2), . . . , 106(D). The users of these devices may opt in to allow for the collection and transfer of telemetry data 402 to one or more servers 112.

The telemetry data 402 may include one or more of device ID 404, cable ID 406, parameter data 138, location data 170, or other data 408.

The device ID 404 may be indicative of a particular electronic device 102. For example, the device ID 404 may comprise make, model, serial number, media access control (MAC) address, and so forth.

The cable ID 406 may comprise information such as make, model, serial number, manufacturer, batch number, date of manufacture, usage statistics and so forth. In some implementations, the cable ID 406 may be provided by circuitry that is part of the cable 104. For example, the cable 104 may include a microcontroller or other device that is able to provide information, such as data indicative of a cable identifier (ID), make, model, manufacturer, batch number, date of manufacture, usage statistics, and so forth.

In other implementations, one or more of the parameter data 138 may be used to provide a "fingerprint" or set of parameter values that may be representative of a particular cable 104, external device 106, or particular combination of cable 104 and external device 106. For example, there may be particular impedance values 146 associated with particular conductors in the cable 104. In another example, the "zero voltage" of the external device 106 may have a particular value that is actually non-zero. By using this information, a particular cable 104 identity may be asserted. Depending upon the number of parameters, and similarity to other known parameter data 138 for other cables, the assertion of identity of the cable 104 may vary in confidence. For example, a cable 104 with an impedance value 146 of 0.1Ω may be easily distinguished from a different cable 104 with an impedance value 146 of 0.5Ω. In some implementations data indicative of a confidence value associated with the cable ID 404 may be maintained.

The parameter data 138 may comprise the values as determined, or digests or summaries of the parameter data 138 as acquired by the electronic device 102.

The location data 170 may comprise information indicative of the location associated with parameter data 138. For example, the location data 170 may indicate that particular impedance values 146 are associated with a particular location.

The other data 408 may include one or more of the other values associated with operation of the cable assessment module 136. For example, the other data 408 may comprise the max cable current value 166, max available current value 168, and so forth.

The server 112 may process the telemetry data 402 using a telemetry assessment module 410. The telemetry assessment module 410 may be used to generate performance report data 412 that is indicative of one or more of the electronic devices 102, cables 104, external devices 106, and so forth. For example, the telemetry assessment module 410 may be used to generate performance report data 412 that indicates, based on the telemetry data 402, that a particular batch of cables 104 produced by a particular manufacturer are exhibiting a failure rate for a particular kind of failure that is greater than expected. Based on this information, various actions may be performed, such as having the manufacturer issue a recall or replacement, prospectively offering replacement cables once early signs of failure are detected, and so forth.

The telemetry data 402 may also be used to provide information that may be used for the maintenance of existing devices, design of other devices, and so forth. For example, information about mismatches in which the external device 106 is unable to provide current to satisfy the device max current value 152 of connected devices may be used to design and deploy an external device 106 that is able to supply this level of current.

Figure 5:
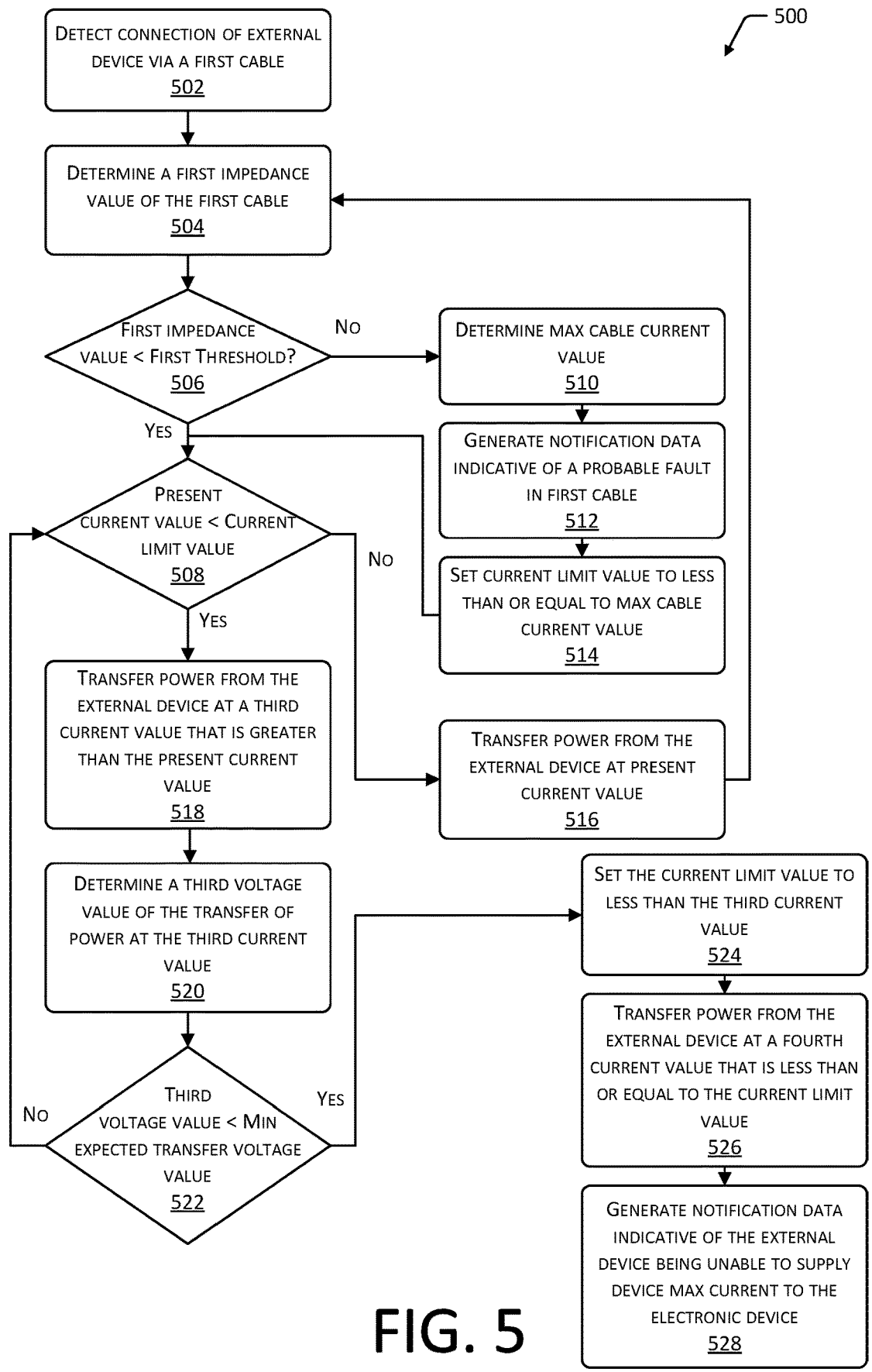
FIG. 5 depicts a flow diagram of a process to determine fault conditions involving one or more of a cable or an external device, according to some implementations.

FIG. 5 depicts a flow diagram 500 of a process to determine fault conditions involving one or more of a cable 104 or an external device 106, according to some implementations. In some implementations, the determination may be performed at least in part by one or more of the PMIC 116, the interface electronics 120, or the processors 122. The process may be used with circuitry utilizing direct current, alternating current, constant power, pulsed power, and so forth.

At 502, the electronic device 102 may detect connection of external device 106 via a first cable 104. For example, upon connection of a USB cable to a USB interface, the interface electronics 120 may generate an interrupt that is indicative of cable connection.

At 504, a first impedance value 146 of the first cable 104 may be determined. For example, as described above with regard to Equation 1, the impedance value 146 may be determined by measuring voltage $V_1$ at a first time while transferring a first current value $I_1$ and measuring voltage $V_2$ while transferring a second current value $I_2$ at the second time. The first current value $I_1$ may be approximately 0 A. For example, the value of $I_1$ may be less than 1 microampere (µA). In comparison, the value of the second current value $I_2$ may be 0.1 A.

At 506, a determination is made as to whether the first impedance value 146 is less than a first threshold value. For example, the threshold data 162 may specify that a cable 104 is deemed to be faulty if the impedance is greater than 0.5Ω, and the first threshold data 162 is thus the threshold deemed to be indicative of a failure in the cable 104. In some implementations the threshold value may be specific to a particular make, model, batch, and so forth of cable 104. If the first impedance value 146 is less than the first threshold value, the process may proceed to 508. Otherwise, the process may proceed to 510.

At 508, a determination is made as to whether the present current value 156 is less than the current limit value 158. For example, a current monitor may be used to determine the current being transferred from the external device 106. If the present current value 156 is greater than or equal to the current limit value 158, the process may proceed to 516. Otherwise, the process may proceed to 518. In some implementations the current limit value 158 may be initialized to a preset value at the beginning of the process.

Returning to 506, if the first impedance value 146 greater than or equal to the first threshold value, the process proceeds to 510. At 510 the max cable current value 166 is determined. For example, the max cable current value 166 may be determined using Equation 3 as described above, based on the thermal power limit value 164 and the first impedance value 146 of the cable 104.

At 512, notification data 172 is generated that is indicative of a probable fault in the first cable 104. As described above, the notification data 172 may be used to present a notification 108 to the user.

At 514 the current limit value 158 is set to a value that is less than or equal to the max cable current value 166. This setting prevents the cable 104 from being used to transfer current in excess of the maximum that could otherwise result in a failure of the cable 104. The process may then proceed to 508.

In some implementations the threshold at which notification data 172 is generated at 512 may differ from the threshold at which the current limit value 158 is set at 514. For example, notification data 172 may be generated responsive to the first impedance value 146 being greater than a first notification threshold of 0.6Ω while the first threshold value is 0.3Ω. As a result, in the event the first impedance value 146 is determined to be 0.4Ω, the process set the current limit value 158 as described at 514, but the generation of notification data 172 at 512 would be omitted until, if ever, the first impedance value 146 is greater than 0.6Ω.

Returning to 508, if the present current value 156 is greater than or equal to the current limit value 158, the process may proceed to 516. At 516, the electronic device 102 continues to transfer power from the external device 106 at the present current value 156. The process may then return to 504.

Returning to 508, if the present current value 156 is less than the current limit value 158, the process may proceed to 518. At 518, power is transferred from the external device 106 at a third current value 144 that is greater than the present current value 156. For example, the PMIC 116 may begin incrementally increasing or "ramping up" the current transferred from the external device 106. For example, the current monitor of the interface electronics 120 may provide the third current value 144.

At 520 a third voltage value 142 associated with the transfer at the third current value 144 is determined. For example, the voltage monitor of the interface electronics 120 may provide the third voltage value 142.

At 522 a determination is made as to whether the third voltage value 142 is less than the min expected transfer voltage value 160. If the third voltage value 142 is greater than or equal to the min expected transfer voltage value 160, the process may return to 508 or 506, with subsequent iterations of the process transferring increased levels of current. If the third voltage value 142 is less than the min expected transfer voltage value 160, the process may proceed to 524.

At 524 the current limit value 158 is set to less than the third current value 144. For example, if the third current value 144 was 0.9 A, the current limit value 158 may be set to 0.8 A, assuming the external device 106 is able to transfer current in 0.1 A increments. This reduction in the current limit value 158 may result in the current transfer from the external device 106 to be less than a level at which the external device 106 is under thermal stress. In some implementations, the fourth current value 144 may be used as the max available current value 168.

At 526 power is transferred from the external device 106 at a fourth current value 144 that is less than or equal to the current limit value 158. Continuing the example above, the fourth current value 144 may be 0.8 A or 0.7 A.

At 528 notification data 172 is generated that is indicative of the external device 106 being unable to supply device max current to the electronic device 102. The notification data 172 may then be used to provide a notification 108 to the user. For example, the notification may be visual as presented on a display device, audible such as speech presented via a speaker, and so forth. The user may then use the information in the notification to acquire one or more of a replacement cable 104 or external device 106.

In some implementations, generation of the notification data 172 at 528 may be responsive to comparison to one or more thresholds. For example, the process may be configured such that the notification data 172 is not generated until the test at 522 being true has occurred at least three times in the last 48 hours.

The process, or a portion thereof, may be executed at regular intervals, at irregular intervals, on demand, responsive to an interrupt, and so forth. For example, as described above at 502, the process may be initiated upon determination of a cable 104 connect, repeated periodically, and discontinued after determination of a disconnect of the cable 104. Different portions of the process may operate at different intervals. For example, checks of impedance may be performed every 60 seconds, while determining the max available current value 168 may be performed once after connection of the cable 104.

Other determinations may also be made by the cable assessment module 136. In another implementation, the maximum available current value 168 may be compared to the max cable current value 166. If the max cable current value 166 is less than the max available current value 168, notification data 172 may be generated that is indicative of the cable 104 being unsuited for transfer at the max available current value 168, and a recommended replacement of the cable 104 may be presented.

The cable assessment module 136 may be configured to limit transfer of current from the external device 106 via the cable 104 to less than or equal to a lesser of the max cable current value 166 or the maximum available current value 168. This prevents possible overheating of the cable 104 or stress on the external device 106.

Figure 6:
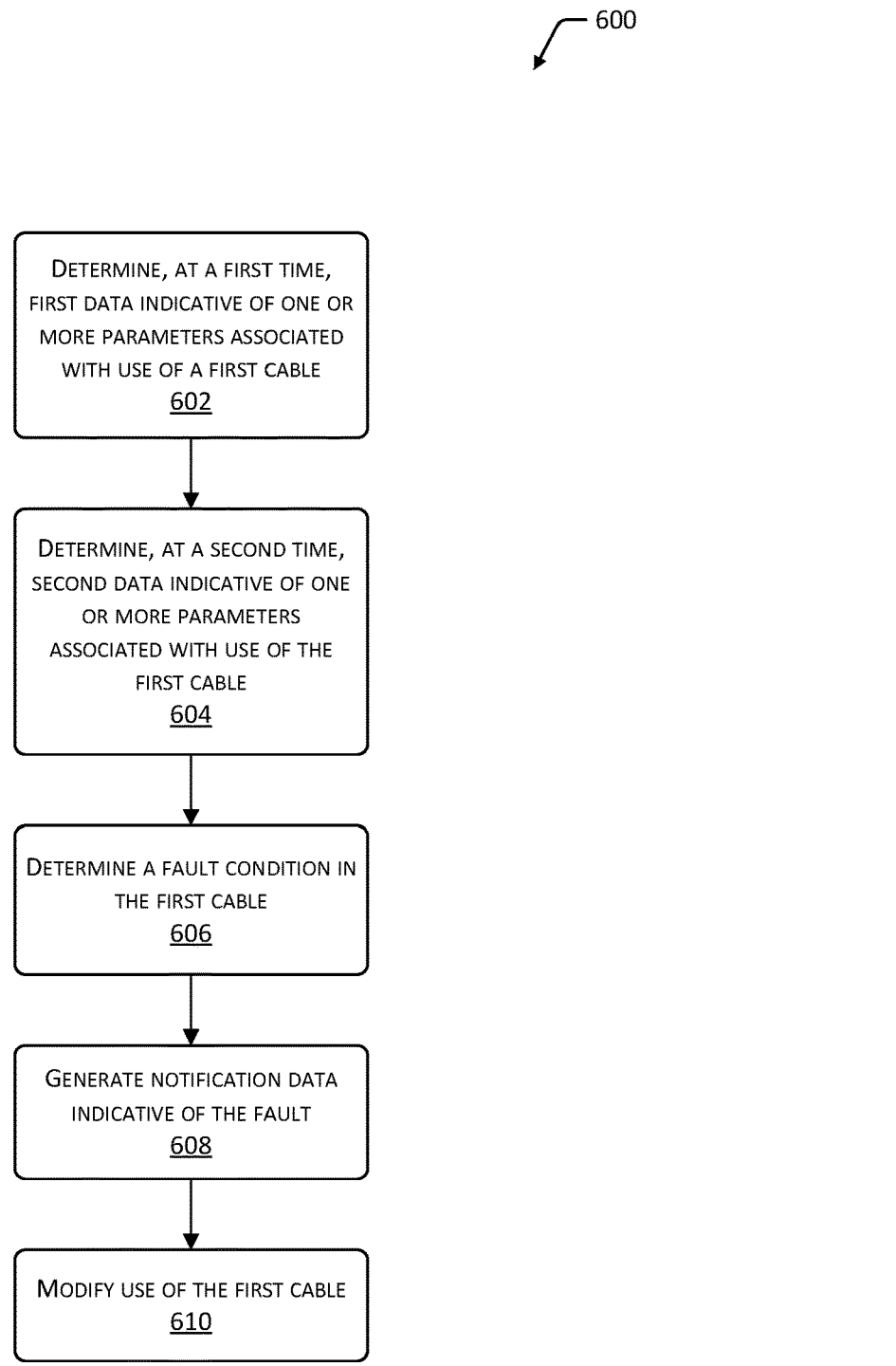
FIG. 6 depicts a flow diagram of a process to determine fault conditions involving a cable by assessing one or more parameters associated with use of the cable at different times, according to some implementations.

FIG. 6 depicts a flow diagram 600 of a process to determine fault conditions involving a cable 104 by assessing one or more parameters associated with use of the cable 104 at different times, according to some implementations.

At 602, at a first time, first data is determined that is indicative of one or more parameters associated with use of a first cable 104. As described above, the parameter data 138 may include one or more attributes associated with operation of the interface electronics 120, cable 104, and so forth. For example, the physical interface 118 and the interface electronics 120 of the electronic device 102 may provide an HDMI interface, to which the cable 104 connects to convey signals to an external display device.

The parameter data 138 may include electrical impedance of one or more electrical conductors in the first cable 104. The parameter data 138 may include optical impedance of one or more optical waveguides in the first cable 104. For example, optical attenuation data for a fiber optic strand in the first cable 104 may be determined. The parameter data 138 may be indicative of a first gain value associated with a transmitter connected to the first cable 104. The parameter data 138 may be indicative of a second gain value associated with a receiver connected to the first cable 104. The parameter data 138 may be indicative of a transmitted signal modification that changes a waveform of a transmitted signal to compensate for propagation effects of the first cable 104. For example, the use and magnitude of pre-emphasis on a transmitted signal in which the voltage swing of the signal is increased. The parameter data 138 may be indicative of a received signal modification that changes a waveform of a received signal to compensate for propagation effects of the first cable 104. For example, the use and magnitude of amplification or attenuation on the received signal may change the waveform of the received signal to compensate for propagation effects of the first cable 104. The parameter data 138 may include data indicative of phase angle of a signal propagated via the first cable 104. The parameter data 138 may also include data indicative of jitter of a signal propagated via the first cable 104. For example, the data indicative of the jitter may indicate the deviation from regular periodicity of the signal with respect to a reference clock.

The parameter data 138 may be obtained at the first time. For example, emphasis data 148 indicative of signal condition that is used while transmitting data to or receiving data from an external device 106 using the first cable 104 may be retrieved from the interface electronics 120 at the first time.

In one implementation, the determination of the first data may be responsive to an indication that the cable 104 has been connected. The process 600 may recur at other times, allowing for ongoing assessment of the cable 104. Determination of a disconnect event in which the cable 104 is no longer connected may result in a cessation of the process.

At 604, at a second time second data is determined that is indicative of one or more of the parameters associated with use of the first cable 104. Continuing the example, parameter data 138 may be obtained at the second time.

In some implementations, the first data may be compared to one or more threshold values. Based at least in part on this comparison, the process may omit the test at a second time as described at 604 and proceed to 606. For example, if the voltage measured between a positive line and a ground of the cable 104 is less than a threshold value, the process may proceed to 606.

At 606 a fault condition in the first cable is determined. This determination may be based on a comparison between the first data and the second data, comparison with historical data, and so forth. For example, the potential fault may be due to an impedance value 146 of the cable 104 exceeding a threshold value. In another example, the fault condition may be determined based on a change in the emphasis data 148. For example, if the emphasis data 148 for the first time indicates no pre-emphasis signal conditioning is being used while at the second time pre-emphasis of +6 dB is being used, the cable 104 may be deemed to be faulty.

At 608 notification data 172 may be generated that is indicative of the fault. As described above, the notification data 172 may then be used to provide a notification 108 to the user. This notification 108 may advise of the fault, provide recommended steps to mitigation such as replacing the cable 104, and may include a link or other reference to the recommended replacement.

At 610 use of the first cable 104 may be modified based on the determination of a fault condition. Continuing the example above, if the interface electronics 120 are now utilizing a +6 dB pre-emphasis on the cable 104, if the first cable 104 continues to degrade the use of the first cable 104 may be modified to allow at least partial operation. For example, the data transmission rate of the signal may be decreased. Continuing the example, the data transmission rate may be dropped from 20 megabits per second (Mbps) to 1.5 Mbps. In another example, the frequency of the transmitted signals may be limited to a maximum frequency that is less than typical operation. For example, attenuation typically increases with frequency. If the cable 104 is unable to operate normally, the interface electronics 120 may be configured to limit the maximum frequency used to transfer data, in an attempt to mitigate increasing impedance in the cable 104. In other implementations, the modification of the use of the cable 104 may include limiting current transferred by the cable 104, such as described above.

In other implementations other functions may be performed by the cable assessment module 136. The cable assessment module 136 may gather parameter data 138 and determine that a cable 104 is suitable for use, such as being fully connected, not being faulty, etc., prior to permitting use of the cable 104. The impedance values 146 may be determined and checked prior to allowing current beyond a threshold value to be transferred via the cable 104. For example, the cable 104 may be used to provide electrical power at 480 V DC, such as in part of an electric vehicle. If the impedance value 146 is not below a threshold value, the interface electronics 120 may prevent the transfer of current greater than 1 A. Once the connection is complete, and the impedance value 146 drops below the threshold value, the interface electronics 120 may permit greater current to flow. This operation may prevent or minimize problems such as arcing, damage from inrush current, and so forth.

The processes described in this disclosure may be executed at regular intervals, at irregular intervals, on demand, responsive to an interrupt, and so forth. For example, the processes may be initiated upon determination of a cable 104 connect, and discontinued after determination of a disconnect of the cable 104. Different portions of the processes may operate at different intervals. For example, checks of impedance may be performed every 10 seconds, while determining the max available current value 168 may be performed once after connection of the cable 104.

Embodiments may be provided as a software program or computer program product including a non-transitory computer-readable storage medium having stored thereon instructions (in compressed or uncompressed form) that may be used to program a computer (or other electronic device) to perform processes or methods described herein. The computer-readable storage medium may be one or more of an electronic storage medium, a magnetic storage medium, an optical storage medium, a quantum storage medium, and so forth. For example, the computer-readable storage media may include, but is not limited to, hard drives, floppy diskettes, optical disks, read-only memories (ROMs), random access memories (RAMs), erasable programmable ROMs (EPROMs), electrically erasable programmable ROMs (EEPROMs), flash memory, magnetic or optical cards, solid-state memory devices, or other types of physical media suitable for storing electronic instructions. Further, embodiments may also be provided as a computer program product including a transitory machine-readable signal (in compressed or uncompressed form). Examples of transitory machine-readable signals, whether modulated using a carrier or unmodulated, include but are not limited to signals that a computer system or machine hosting or running a computer program can be configured to access, including signals transferred by one or more networks. For example, the transitory machine-readable signal may comprise transmission of software by the Internet.

Separate instances of these programs can be executed on or distributed across any number of separate computer systems. Thus, although certain steps have been described as being performed by certain devices, software programs, processes, or entities, this need not be the case and a variety of alternative implementations will be understood by those having ordinary skill in the art.

Specific physical embodiments as described in this disclosure are provided by way of illustration and not necessarily as a limitation. Those having ordinary skill in the art readily recognize that alternative implementations, variations, and so forth may also be utilized in a variety of devices, environments, and situations. Although the subject matter has been described in language specific to structural features or methodological acts, it is to be understood that the subject matter defined in the appended claims is not necessarily limited to the specific features or acts described. Rather, the specific features, structures, and acts are disclosed as exemplary forms of implementing the claims.

What is claimed is:
1. A device comprising:
   a universal serial bus (USB) physical interface having a first connector that is configured to connect to a first end of a USB cable;
   a USB controller that is connected to the USB physical interface;
   a battery that is connected to the USB controller;
   a memory, storing first computer-executable instructions; and
   a hardware processor connected to the USB controller, the hardware processor to execute the first computer-executable instructions to:
      determine that the USB physical interface is connected to an external device via the USB cable;
      accept power from the external device at a first current value;
      determine a first voltage value indicative of a first voltage provided by the external device at the first current value;
      receive power from the external device at a second current value, wherein the second current value is greater than the first current value;
      determine a second voltage value indicative of a second voltage provided by the external device at the second current value;
      determine a first impedance value of the USB cable as

(the second voltage value−the first voltage value)/
(the second current value−the first current value);

determine a thermal power limit value that is indicative of a maximum permitted power dissipation associated with use of the USB cable and a portion of USB physical interface that connects to the USB cable;

determine a maximum cable current value as square root of (the thermal power limit value/the first impedance value); and receive power from the external device at a third current value, wherein the third current value is greater than the first current value and less than or equal to the maximum cable current value.

2. The device of claim 1, further comprising:
the memory, storing second computer-executable instructions; and
the hardware processor to execute the second computer-executable instructions to:
 determine a third voltage value indicative of a third voltage at the third current value;
 determine the third voltage value is less than an expected transfer voltage value, wherein the expected transfer voltage value is based at least in part on a difference between the first voltage and a product of the third current value and the first impedance value; and
 generate a notification indicative of the external device being unable to provide power at the third current value.

3. The device of claim 1, further comprising:
the memory, storing second computer-executable instructions; and
the hardware processor to execute the second computer-executable instructions to:
 determine a fourth current value indicative of a maximum available current that the external device is able to supply;
 determine that the maximum cable current value is less than the fourth current value; and
 generate a notification indicative of the USB cable being unsuited to transfer the maximum available current from the external device.

4. A method comprising:
determining, by a first device at a first time, a first impedance value of a first cable;
determining, by the first device at a second time, a second impedance value of the first cable, wherein the first time occurred before the second time;
determining, by the first device based on the second impedance value, a first current value indicative of a maximum permissible current for transfer by the first cable;
determining, by the first device, a second current value indicative of a maximum amount of current that an external device is able to supply;
limiting, by the first device, transfer of current via the first cable to less than or equal to a lesser of the first current value or the second current value; and
based at least in part on the first impedance value and the second impedance value, generating notification data indicative of a fault condition.

5. The method of claim 4, further comprising:
determining the fault condition is further based at least in part on the first current value, or the second current value, wherein the fault condition corresponds to either the first cable or the external device.

6. The method of claim 5,
wherein the notification data is indicative of one or more of a replacement cable or replacement external device.

7. The method of claim 4, further comprising:
determining, by the first device at a third time, a third impedance value of the first cable;
determining a difference between the second impedance value and the third impedance value exceeds a threshold value that is indicative of a failure of the first cable; and
wherein generating the notification data is indicative of a fault in the first cable.

8. The method of claim 4, wherein determining the first impedance value further comprises:
determining that the external device is connected to the first device via the first cable;
receiving power from the external device at a third current value;
determining a first voltage value indicative of a first voltage at the third current value;
receiving power from the external device at a fourth current value;
determining a second voltage value indicative of a second voltage at the fourth current value;
determining a first difference between the second voltage value and the first voltage value;
determining a second difference between the fourth current value and the third current value; and
dividing the first difference by the second difference to determine the second impedance value.

9. The method of claim 4, wherein determining the first current value further comprises:
determining a thermal power limit value that is indicative of a maximum permitted power dissipation for the first cable; and
calculating a square root of a quotient comprising the thermal power limit value as divided by the second impedance value.

10. The method of claim 4, further comprising:
determining a first voltage value that is indicative of a voltage provided by the external device at a third current value, wherein the third current value is less than a first threshold value associated with minimal transfer of current from the external device;
determining an expected transfer voltage based at least in part on a difference between the first voltage value and a product of the first current value and the second impedance value; and
wherein limiting the transfer of current further comprising:
 determining that a second voltage value indicative of a voltage provided by the external device during the transfer of current is less than the expected transfer voltage; and
 decreasing the transfer of current via the first cable.

11. The method of claim 4, wherein determining the second current value further comprises:
determining a first voltage value that is indicative of a voltage provided by the external device while transferring current at a third current value, wherein the third current value is less than a first threshold value that is associated with minimal transfer of current from the external device;

determining an expected transfer voltage value based at least in part on a difference between the first voltage value and a product of the first current value and the second impedance value;
determining a second voltage value that is indicative of a voltage at a fourth current value that is greater than the third current value;
determining the second voltage value is greater than the expected transfer voltage value;
receiving, via the first cable, current at a fifth current value that is greater than the fourth current value;
determining a third voltage value that is indicative of a voltage at the fifth current value;
determining the third voltage value is less than the expected transfer voltage value; and
designating the fourth current value as the second current value.

12. The method of claim 4, further comprising:
receiving power from the external device at a third current value;
determining a first voltage value indicative of a first voltage at the third current value; and
identifying combined use of the first cable and the external device based on the second impedance value and the first voltage value.

13. The method of claim 4, further comprising:
determining that the second impedance value is less than a first impedance threshold value, wherein the first impedance threshold value is indicative of the first device being connected to the external device via the first cable; and
receiving, at a second time after the first time, current at a third current value that is above a first current threshold value.

14. The method of claim 4, further comprising:
determining identification data indicative of the first cable; and
retrieving the first impedance value based on the identification data.

15. A method comprising:
determining, by a first device at a first time, a first impedance value;
determining, by the first device at a second time, first data indicative of one or more parameters associated with use of a first cable to connect the first device and a second device to transfer one or more of data or power between the first device and the second device;
determining, by the first device at a third time, second data indicative of the one or more parameters associated with use of the first cable to connect the first device and the second device to transfer the one or more of data or power between the first device and the second device;
determining, by the first device and based at least in part on using one or more of the first data or the second data and the first impedance value, a fault condition in the first cable; and
responsive to the fault condition, generating notification data indicative of the fault condition.

16. The method of claim 15, wherein the one or more parameters are indicative of one or more of:
electrical impedance of one or more electrical conductors in the first cable,
optical impedance of one or more optical waveguides in the first cable,
a first gain value associated with a transmitter connected to the first cable,
a second gain value associated with a receiver connected to the first cable,
a transmitted signal modification that changes a waveform of a transmitted signal to compensate for propagation effects of the first cable,
a received signal modification that changes a waveform of a received signal to compensate for propagation effects of the first cable,
phase angle of a signal propagated via the first cable, or
jitter of a signal propagated via the first cable.

17. The method of claim 15, wherein determining the fault condition further comprises one or more of:
determining a difference between the first data and the second data that exceeds a threshold value,
comparing the first data with a first threshold value, or
comparing the second data with a second threshold value.

18. The method of claim 15, wherein the one or more parameters include the first impedance value, and the determining the first impedance value for one or more of the first data or the second data comprising:
transferring power from an external device at a first current value;
determining a first voltage value indicative of a first voltage provided by the external device during transfer of power at the first current value;
transferring power from the external device at a second current value;
determining a second voltage value indicative of a second voltage provided by the external device during transfer of power at the second current value;
determining a first difference between the second voltage value and the first voltage value;
determining a second difference between the second current value and the first current value; and
dividing the first difference by the second difference.

19. The method of claim 15, further comprising:
based on the fault condition, changing from a first value to a second value one or more of:
current transferred by the first cable,
data transmission rate of a signal transferred by the first cable, or
frequency of a signal transferred by the first cable.

20. The method of claim 15, further comprising:
determining identification data indicative of the first cable; and
retrieving the first impedance value based on the identification data.

* * * * *